United States Patent [19]

Werking

[11] Patent Number: 5,798,658
[45] Date of Patent: Aug. 25, 1998

[54] SOURCE-COUPLED LOGIC WITH REFERENCE CONTROLLED INPUTS

[76] Inventor: Paul M. Werking, 13620 Wagram Rd., Pickerington, Ohio 43147

[21] Appl. No.: 732,209

[22] Filed: Oct. 16, 1996

Related U.S. Application Data

[63] Continuation of Ser. No. 490,336, Jun. 15, 1995, abandoned.
[51] Int. Cl.⁶ .................................. H03K 19/0944
[52] U.S. Cl. .................. 326/17; 326/34; 326/115; 327/77
[58] Field of Search ........................ 326/112, 114, 326/115, 119, 83, 31, 34; 6/121; 327/56, 77–78, 89, 563, 541, 543

[56] References Cited

U.S. PATENT DOCUMENTS

| | | |
|---|---|---|
| 4,686,392 | 8/1987 | Lo .................................. 326/115 |
| 4,808,851 | 2/1989 | Chantepie .......................... 326/115 |
| 4,833,347 | 5/1989 | Rabe ................................ 326/115 |
| 5,149,992 | 9/1992 | Allstot ............................. 326/115 |
| 5,177,378 | 1/1993 | Nagasawa .......................... 326/115 |

*Primary Examiner*—Jon Santamauro
*Attorney, Agent, or Firm*—Frank H. Foster; Kremblas, Foster, Millard & Pollick

[57] ABSTRACT

This invention relates to source-coupled logic (SCL) which is a functional derivative of emitter-coupled logic (ECL). ECL is widely recognized as having the characteristics of high speed (low propagation delay) and low power supply noise generation. The SCL of the prior art succeeds at maintaining and improving the low noise characteristics of this architecture but does not fulfill the promise of high speed that one would expect from a current-mode logic. In addition, it uses a differential form of logic that is not as flexible and easy-to-use as a reference controlled or "single-ended" logic. The SCL disclosed here has the desired high speed properties and maintains the ease of use that is a property of reference controlled ECL. In addition, the reference controlled SCL of this invention provides new capabilities that make it even more flexible than ECL in generating logical switching functions.

20 Claims, 7 Drawing Sheets

SOURCE-COUPLED LOGIC WITH REFERENCE CONTROLLED INPUTS

This is a continuation of application Ser. No. 08/490,336, filed Jun. 15, 1995, now abandoned.

TECHNICAL FIELD

This invention relates generally to digital logic circuits and more particularly relates to a MOSFET source-coupled logic circuit which is faster, can be implemented with fewer transistors and avoids double-ended or complementary differential logic.

BACKGROUND ART

This invention relates to source-coupled logic (SCL) which is a functional derivative of emitter-coupled logic (ECL). ECL is widely recognized as having the characteristics of high speed (low propagation delay) and low power supply noise generation. The SCL of the prior art succeeds at maintaining and improving the low noise characteristics of this architecture but does not fulfill the promise of high speed that one would expect from a current-mode logic. In addition, it uses a differential form of logic that is not as flexible and easy-to-use as a reference controlled or "single-ended" logic. The SCL disclosed here has the desired high speed properties and maintains the ease of use that is a property of reference controlled ECL. In addition, the reference controlled SCL of this invention provides new capabilities that make it even more flexible than ECL in generating logical switching functions.

A schematic diagram of a generic ECL inverter/buffer circuit is shown in FIG. 1. For clarity, the pull-down resistors that are required at the outputs have been omitted. Descriptions of the operation of this circuit have been widely disseminated (including U.S. Pat. No. 3,259,761 and [1]). In essence, the input signal, $V_{IN}$, is compared with a reference voltage, $V_{BB}$, by a differential pair of matched bipolar junction transistors (BJTs), Q1 and Q2. The relative values of $V_{IN}$ and $V_{BB}$ determine whether a bias current common to the emitters of Q1 and Q2, $I_{EE}$, is directed to one of two resistors, R1 or R2. When $V_{IN}<V_{BB}$, this bias current flows through transistor Q2 resulting in a voltage drop across resistor R2. This voltage is both buffered and level-shifted by an output emitter-follower transistor, Q4, resulting in a logic low voltage at the $V_O$ output. Simultaneously, the absence of any current flowing through R1 results in a logic high voltage at the inverting output, $V_{O\_N}$. When $V_{IN}>V_{BB}$, the $I_{EE}$ bias current flows through transistor Q1 causing a voltage drop across resistor R1 rather than resistor R2. In this case, a low voltage, or logic 0, is developed at the inverting output, $V_{O\_N}$, while a high voltage, or logic 1, is developed at the non-inverting output, $V_O$. A reference voltage, $V_{BB}$, that is midway between the logic high and low voltages is supplied by an external bias circuit. A single bias circuit is usually shared by many ECL gate circuits. This bias circuit also regulates the value of $I_{EE}$; typically by employing another BJT.

The essential aspects of a differential SCL gate are shown in FIG. 2. (See U.S. Pat. No. 5,149,992 and [2-3].) The inverter/buffer shown here uses metal-oxide-semiconductor (MOS) field effect transistors (FETs) rather than BJTs but operation is similar. When $V_{IN}<V_{INN}$, the common source bias current, $I_{SS}$, flows through transistor M2 but not transistor M1 developing a low voltage at the non-inverting output, $V_O$, and a high voltage at the inverting output, $V_{O\_N}$. When $V_{IN}>V_{INN}$ the opposite occurs: $V_O$ assumes a high, logic 1, voltage and $V_{O\_N}$ assumes a low, logic 0, voltage. The logic input to this inverter/buffer gate consists of a pair differential of voltages, $V_{IN}$ and $V_{INN}$, that each assume opposite states. While the use of two voltages to convey one signal can present several problems, it greatly simplifies the bias circuit. In fact, the bias circuit may be eliminated altogether if it is not necessary to closely regulate the value of $I_{SS}$ for optimum performance.

The circuit of FIG. 2 assumes the use of enhancement mode N-type MOSFETs which typically have a positive threshold voltage that is of the same magnitude as the forward voltage of the NPN BJTs used in ECL circuits. It is also possible to perform logical switching functions by substituting FETs which have a lower threshold voltage, or even a negative threshold voltage (i.e., depletion mode FETs). Such source-coupled FET logic (SCFL) gates (see U.S. Pat. Nos. 3,783,400 and [4-5]) typically employ one or more forward biased diodes between the output source-follower transistors and their respective gate output terminals to increase the amount of voltage level-shifting provided, otherwise, the operation of a SCFL gate is the same as that of a SCL gate. Applicant cites the following art:

U.S. Pat. Nos.

3,259,761 July/1966 Narud et al. 307/88.5

5,149,992 September/1992 Allstot et al. 307/448

4,661,725 April/1987 Chantepie 307/450

Other References

[1] Charles S. Meyer, David K. Lynn, and Douglas J. Hamilton, *Analysis and Design of Integrated Circuits*, McGraw-Hill Publishing Co., New York, 1968.

[2] Sayfe Kiaei, San-Hwa Chee and Dave Allstot, "CMOS Source-Coupled Logic for Mixed-Mode VLSI," 1990 IEEE International Symposium on Circuits and Systems, vol. 2, pg. 1608–1611, IEEE, 1990.

[3] Dave J. Allstot, San-Hwa Chee, Sayfe Kiaei, and Manu Shrivastawa, "Folded Source-Coupled Logic vs. CMOS Static Logic for Low-Noise Mixed-Signal ICs," IEEE Transactions on Circuits and Systems-I, vol. 40, no. 9, pg. 553–563, IEEE, September 1993.

[4] Stephen I. Long and Steven E. Butner, *Gallium Arsenide Digital Integrated Circuit Design*, McGraw-Hill Publishing Co., New York, 1990.

[5] S. Katsu, S. Nambu, A. Shimanoa and G. Kano, "A GaAs Monolithic Frequency Divider Using Source Coupled FET Logic," IEEE Electron Device Letters, vol. EDL-3, no. 8, pp. 197–199, August 1982.

[6] *An ECL and TTL Compatible Source-Coupled Logic Using Reference Controlled Inputs*, Paul M. Werking, thesis submitted for Master's Degree at The Ohio State University, June 1994.

BRIEF DISCLOSURE OF INVENTION

The invention is a MOSFET logic circuit for connection between a pair of power buses for supplying power. It has a pair of source coupled input transistors, the gate of one forming the logic circuit input and the gate of the other connected to a bias circuit shared with other logic circuits and providing a reference voltage. First and second pull-up resistive circuits elements are connected between the respective different outputs of the input transistors and one bus. The different respective inputs of a pair of output transistors connected in a source-follower configuration are connected to the different respective outputs of the input transistors. A transistor, for conveying a constant current, is connected between the coupled input transistor sources and the other power bus and has its gate input connected to an external bias circuit shared by other such logic circuits for control of the constant current by the bias voltage applied to its gate.

The circuit may be enhanced by utilizing a MOSFET transistor as the resistive circuit elements with their gates connected to an external bias circuit shared by other such logic circuits for supplying a conductance controlling voltage. The circuit may also be enhanced by providing pull-down transistors each connected to the output of a respective different output transistor and controlled by a voltage supplied by an external bias connected to the input of each pull-down transistor.

DETAILED DESCRIPTION

Figure 3:
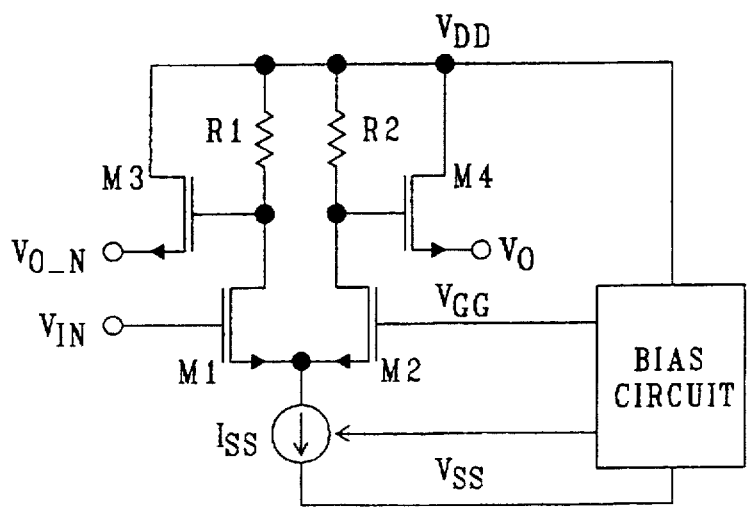
FIG. 3 shows the essential elements of a reference controlled SCL inverter/buffer gate.

The essential elements of an inverter/buffer circuit using the reference controlled source-coupled logic (SCL) of this invention are shown in FIG. 3. (See also [6].) The operation of this circuit is similar to that of the ECL inverter/buffer of FIG. 1. When the input voltage, $V_{IN}$, is less than that of a reference voltage, $V_{GG}$, the common source bias current, $I_{SS}$, flows through transistor M2 but not M1 resulting in a low voltage at the non-inverting output, $V_O$, and a high voltage at the inverting output, $V_{O\_N}$. When $V_{IN} > V_{GG}$ the opposite occurs: $V_O$ assumes a high, logic 1, voltage and $V_{O\_N}$ assumes a low, logic 0, voltage.

Figure 2:
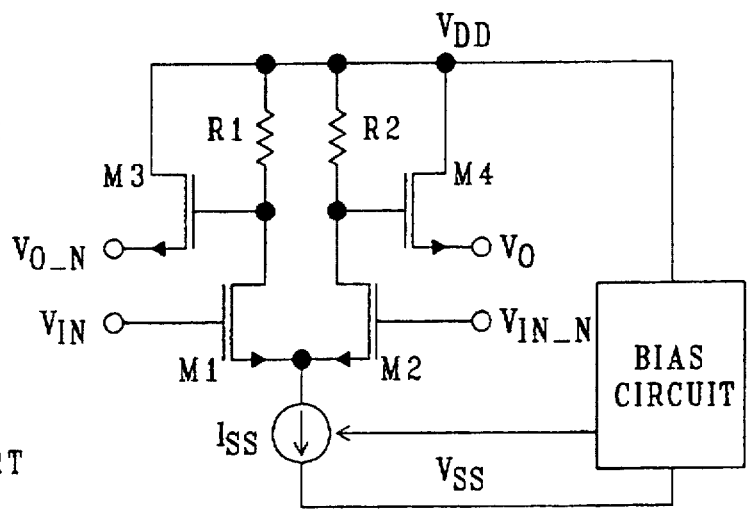
FIG. 2 shows the essential elements of a differential SCL inverter/buffer gate.
Figure 4:
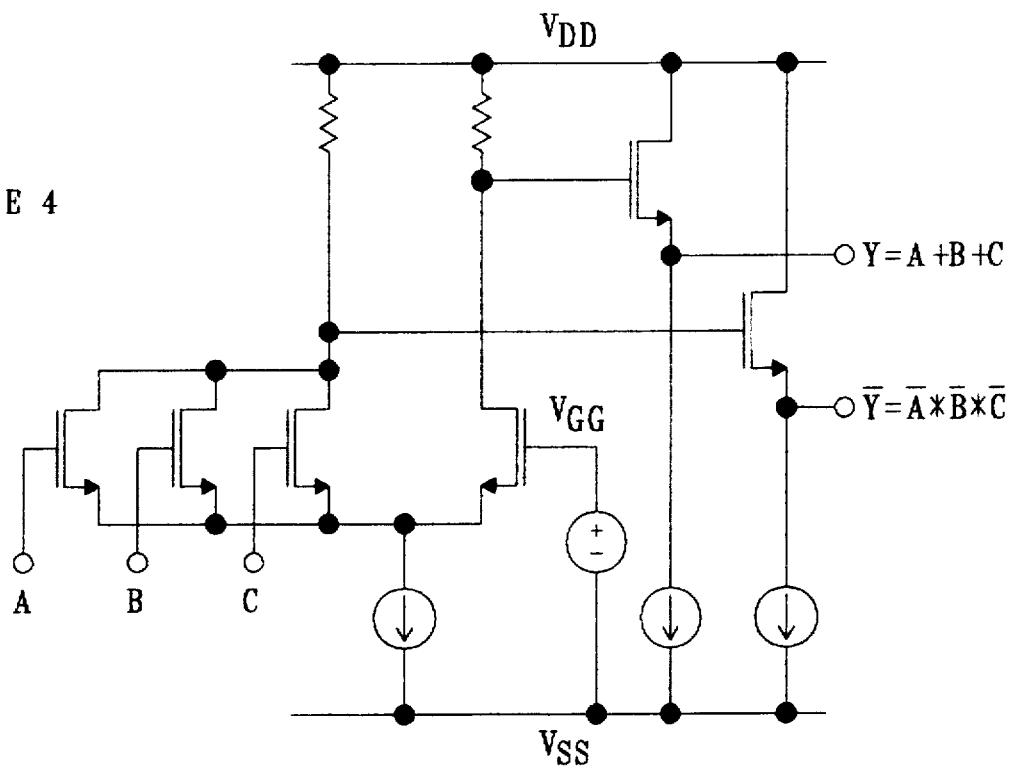
FIG. 4 shows the essential elements of a multiple input reference controlled SCL OR/NOR gate.
Figure 5:
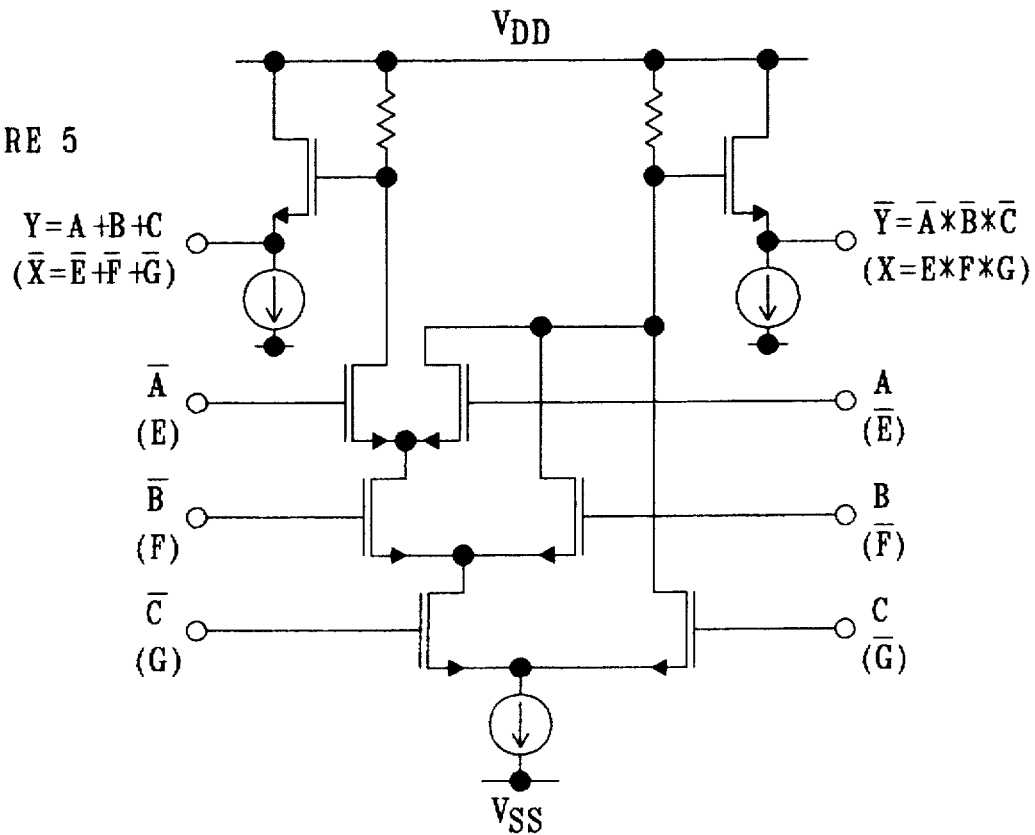
FIG. 5 shows the essential elements of both a multiple input differential SCL OR/NOR gate and a multiple input differential SCL AND/NAND gate.

One difference between this invention and the prior art of FIG. 2 is the use of a voltage reference, $V_{GG}$, supplied by a bias circuit. The importance of this voltage reference is illustrated in FIGS. 4 and 5. Both figures show the essential elements of a three-input OR/NOR gate. A reference controlled SCL gate is shown in FIG. 4 while a differential SCL gate is shown in FIG. 5. In the reference controlled SCL of FIG. 4, the three-input OR/NOR gate requires two more transistors to implement than an inverter/buffer. In contrast, the three-input differential OR/NOR gate of FIG. 5 requires four additional transistors. In general, two transistors must be added for every differential SCL gate input while only one must be added for every reference controlled SCL gate input.

Figure 6:
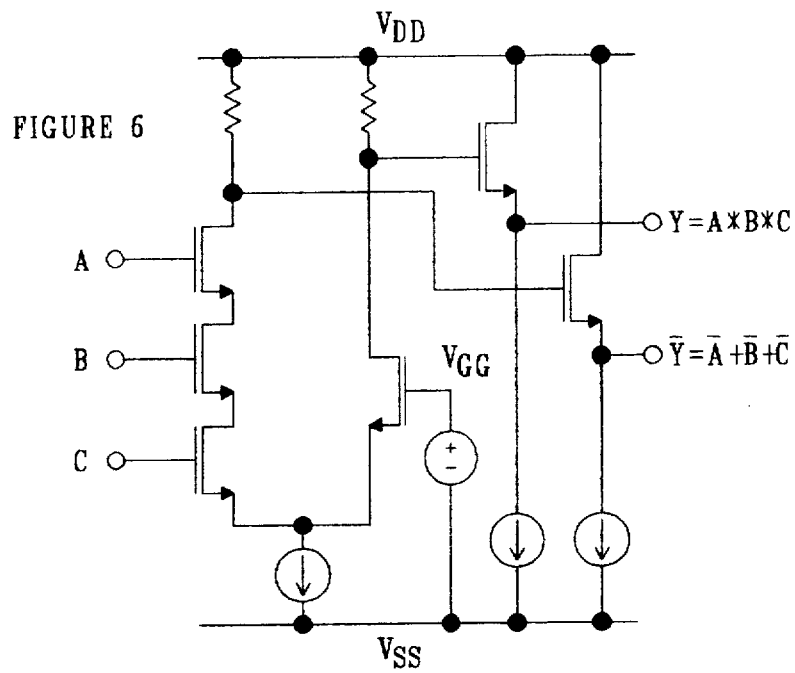
FIG. 6 shows the essential elements of a multiple input reference controlled SCL AND/NAND gate.

This is true for AND/NAND gates as well as for OR/NOR gates. The essential elements of a three-input reference controlled SCL AND/NAND gate are shown in FIG. 6. In this circuit, three transistors (one for each input) are connected in series to implement the AND switching function. A differential SCL AND/NAND gate, on the other hand, uses six transistors (two for each input) connected as shown in FIG. 5. Note that this is the same circuit diagram as that shown for the differential three-input OR/NOR gate because for differential logic both gates are the same: it is only necessary to invert the input and output signal names. (The signal names for the AND/NAND gate are shown in parenthesis.) The series gating technique used for reference controlled SCL is also simpler than that used for ECL AND/NAND gates. Not only do ECL AND/NAND gates require two transistors per input but they also require a separate reference voltage, $V_{BB}$, for each input transistor pair. Using reference controlled SCL, it is possible to make a complex gate implementing any arbitrary switching function in a straightforward manner by connecting input transistors in a series/parallel combination.

Figure 7:
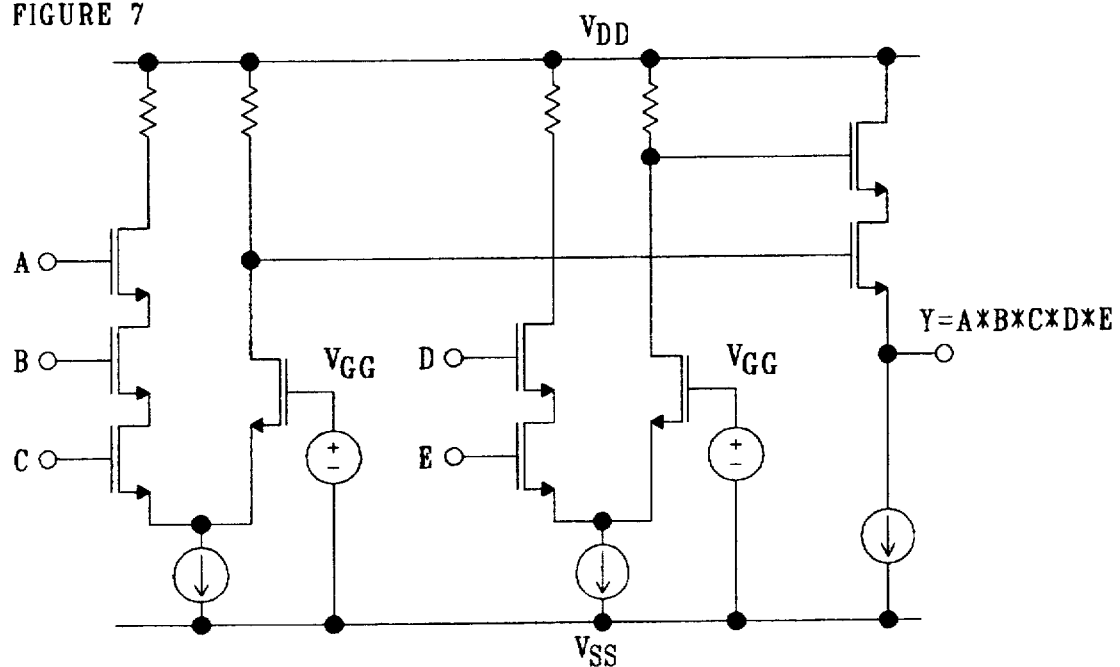
FIG. 7 illustrates the method of forming a series-gated AND of two reference controlled gate outputs.

Like ECL, reference controlled SCL also permits the outputs of separate gates to be wire-ORed and dot-ANDed. Wire-ORing is a technique in which the outputs of two or more gates are shorted together. The combined output is the logical OR of the individual gate outputs and exhibits negligible delay. Dot-ANDing, also called "collector dotting" for ECL, is a technique in which two or more output transistors are merged into a single output transistor, consequently shorting together the nodes that would normally drive the separate gate(base) terminals of these MOS(BJT) transistors. The single output thus formed is the logical AND of the original outputs. Dot-ANDed outputs are significantly slower than the original individual outputs but are still faster than a cascaded circuit. Unlike either ECL or differential SCL, reference controlled SCL permits a series-gated AND of two outputs. This technique is illustrated in FIG. 7 and imposes less of a speed penalty than dot-ANDing. It also allows a normal gate output to co-exist with a series-gated output.

The reference controlled SCL of this invention also has improved speed performance, lower propagation delay, over the prior art. Referring to the detailed schematic diagram of a reference controlled SCL inverter/buffer shown in FIG. 8, this invention uses a bias circuit that maximizes the voltage difference between output high, $V_{OH}$, and low, $V_{OL}$, logic levels and also reduces the product of resistance and capacitance at the gates of the output source-follower transistors. As a result, the SCL of this invention has a speed-power product that is lower than that of both ECL and the prior SCL [6]. These techniques may also be used to improve the performance of differential SCL.

Figure 9:
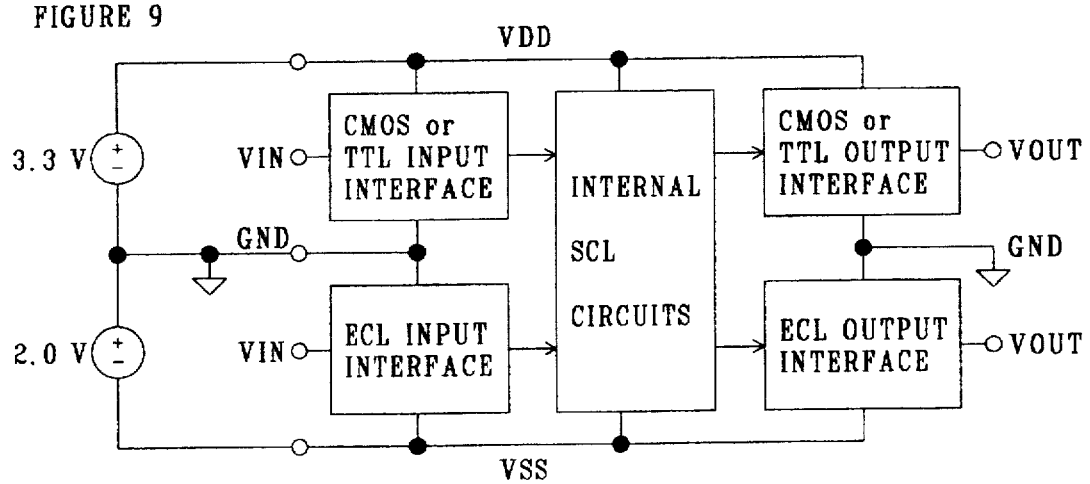
FIG. 9 illustrates the use of two series connected voltage sources to supply power to a reference controlled SCL circuit.

Another feature of the SCL of this invention is that two voltage sources, rather than one, may be used to supply power to an SCL circuit as illustrated in FIG. 9. These two voltage sources, with nominal values of approximately 3.3 volts and 2.0 volts, are connected in series to provide a voltage of nominally 5.3 volts to the reference controlled SCL. Although this method of power delivery does not affect the internal SCL circuits themselves, it does simplify the design of the output interface circuits and permits great flexibility in the application of SCL to existing systems. As shown in FIG. 9, this technique permits a single SCL circuit to interface to ECL, TTL, and CMOS logic circuits, as well as analog circuits and differential SCL, all simultaneously on the same integrated circuit (IC).

Figure 1:
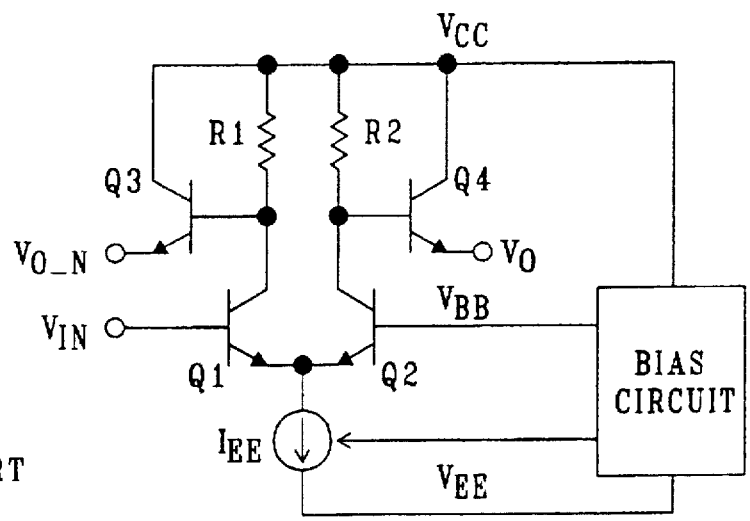
FIG. 1 shows the essential elements of an ECL inverter/buffer gate.
Figure 8:
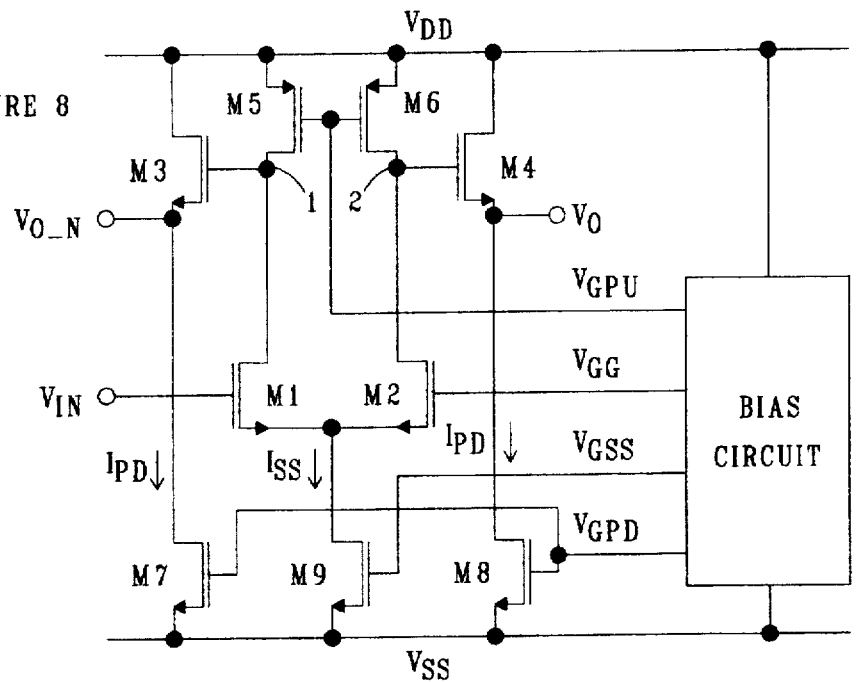
FIG. 8 is a detailed schematic diagram of a reference controlled SCL inverter/buffer.

A detailed schematic diagram of a reference controlled SCL inverter/buffer is shown in FIG. 8. The basic operation of this circuit is the same as that for the simplified circuit of FIG. 3 which was discussed earlier. In the more detailed schematic of FIG. 8, the pull-up resistors are replaced by p-channel MOS transistors M5 and M6. These transistors are biased in their triode or ohmic region so that they perform the function of a voltage controlled resistor. The value of this resistance is controlled by the $V_{GPU}$ output of the bias circuit. The bias current for the input differential pair of transistors, $I_{SS}$, is provided by M9 which is controlled by $V_{GSS}$. The function of the output pull-down resistors, which were intentionally omitted from FIGS. 1-3, is performed in FIG. 8 by transistors M7 and M8. These transistors may be biased in either the triode region or the saturation region as desired (i.e., they may be used as either resistors or current sinks). In FIG. 8 however, it is assumed that they are biased to provide a pull-down current of $I_{PD}$. This figure illustrates the general case in which transistors M7 and M8 are controlled by a separate $V_{GPD}$ bias voltage. Since it is generally desired to have a fixed ratio between $I_{SS}$ and $I_{PD}$, it is also possible to drive the gates of transistors M7 and M8 with $V_{GSS}$ and maintain the desired current ratio by scaling the widths of M7 and M8 appropriately. Note that if the outputs of two or more SCL gates are wire-ORed together, it is usually sufficient to use just one pull-down transistor for the combined output. As shown in FIG. 3, the voltage threshold of the reference controlled SCL gate, $V_{GG}$, is also supplied by the bias circuit.

Figure 10:
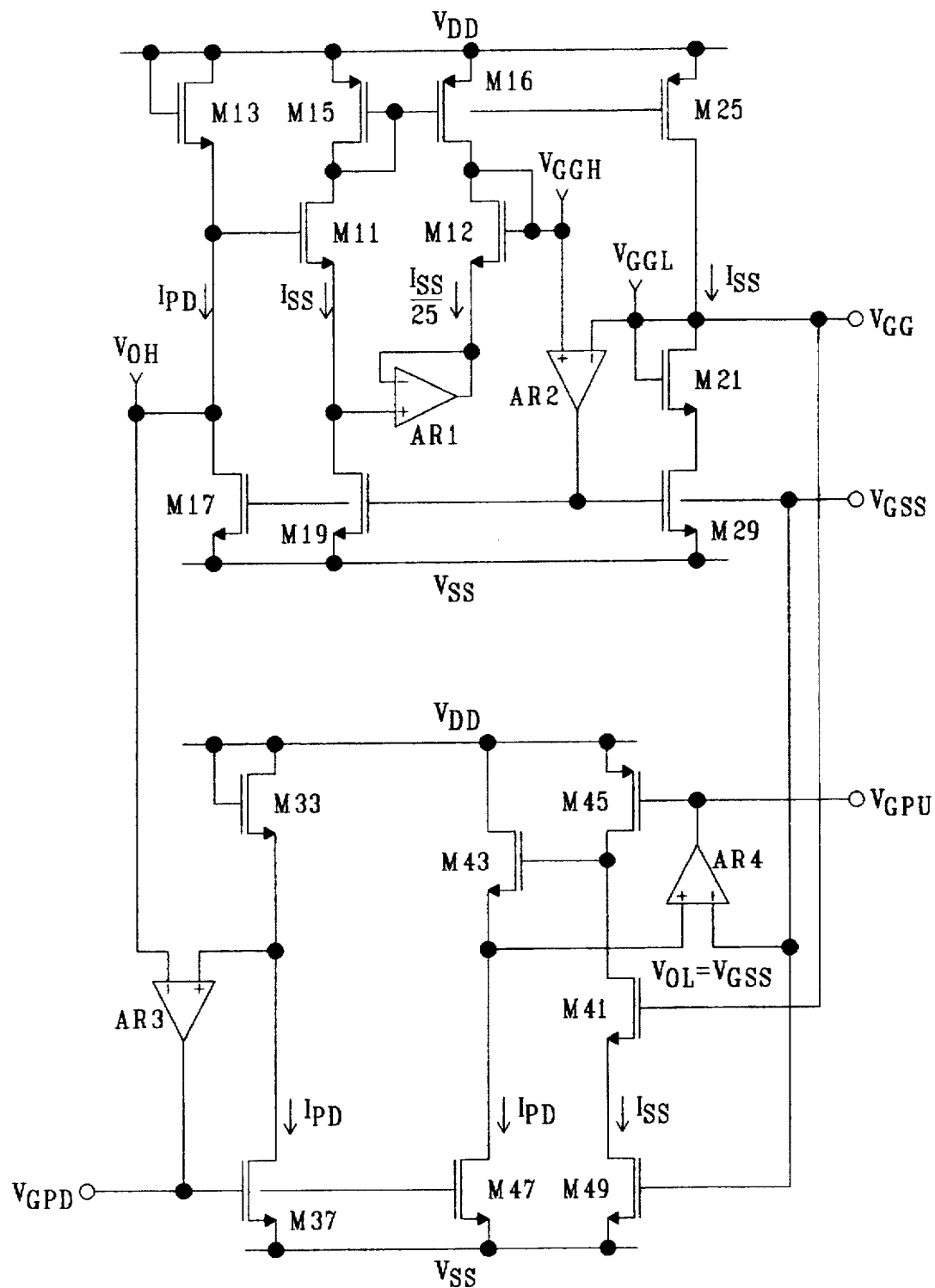
FIG. 10 is a detailed schematic diagram of a bias circuit for the reference controlled SCL of this invention that implements the desired bias methodology.

A detailed schematic diagram of one possible bias circuit is shown in FIG. 10. Since there are many possible ways to design this circuit, it is beneficial to describe the general method of biasing used before launching into a detailed description of this specific implementation. The conventional approach to the design of a bias circuit is to start with certain assumptions about the DC operation of the logic gate. Such considerations may include the voltage and/or current values of the logic states, the power supply voltage (s), the maximum power dissipation and/or overall size of the circuit, and the control of certain critical processes parameters such as threshold voltage, mobility, gate oxide thickness, and dimensional accuracy/repeatability. After taking into account all of these factors (and perhaps others besides) a fairly conservative design that attempts to meet all of these DC constraints is developed which, not surprisingly, has less than optimum AC performance. For small dimension MOS transistors, this approach is very difficult due to the large variations in these critical parameters. In essence, the conventional approach is to design for the DC constraints and take whatever one can get in terms of AC performance (i.e.: gate propagation delay). The approach taken by this invention is essentially the reverse of the conventional approach in that the AC performance is optimized and the resultant DC parameters are allowed to fall where they may. As a consequence of this, the DC values of the high and low logic levels, $V_{OH}$ and $V_{OL}$, vary so widely that it is probably not feasible, given the current state of the art, to use these logic levels to transmit data between separate reference controlled SCL ICs (let alone separate printed circuit boards or systems) Therefore, it is necessary to translate the internal SCL logic levels of this invention to other industry standard logic levels at all chip inputs and outputs. However, this is not considered to be a serious disadvantage because such logic level translators are easily implemented (especially with dual power supplies) and would be necessary anyway for widespread commercial application.

The AC performance of an SCL gate, either reference controlled or differential, is dominated by the RC time constant of the nodes (see 1 and 2 in FIG. 8) connected to the gates of the output source-follower transistors [6]. In order to maximize performance, it is necessary to minimize both the capacitance of these nodes and the resistance of the pull-up "resistors" M5 and M6. The capacitance of these nodes is determined by the physical layout of the circuit and, especially, by the size of the output source-follower transistors, M3 and M4. To minimize this capacitance, careful attention must be paid to physical layout and to the sizing of the output transistors with respect to logic gate fanout. To minimize the resistance of the pull-up transistors, the input transistors M1 and M2 must be driven as hard as possible in order to maximize $I_{SS}$. Or, to put this another way, the value of $I_{SS}$ should be maximized and the width of the input transistors should be minimized. This optimum occurs when the voltage difference between the high and low output logic levels, $V_{OH}-V_{OL}$, is at a maximum: namely, when:

$$V_{OH}=V_{DD}-V_{T3H}-V_{DS3SAT} \tag{1}$$

and $$V_{OL}=V_{DS9SAT}+V_{TLL}. \tag{2}$$

The optimum value of $V_{GG}$ is the simple average of $V_{OH}$ and $V_{OL}$.

It should be noted that the AC performance of the prior art [see FIG. 1 of U.S. Pat. No. 5,149,992] was significantly limited by the adoption of a diode-connected pull-up transistor which lowered the value of $V_{OH}$ to approximately $$V_{OH}=V_{DD}-V_{T3H}-V_{DS3SAT}-V_{T5}. \tag{3}$$

It should also be noted that $V_{OH}$ may be significantly increased by connecting the well, or bulk, of the output source-follower transistor to its source terminal rather than $V_{SS}$ in order reduce the bulk effect on the threshold voltage of this transistor. Of course this may only be done if a P-well or twin-tub process is available. Once these logic levels are established, the value of $I_{SS}$ may be set to $$I_{SS}=(W_1/L_1) (\mu_N C_{OX}/2) V^2_{DS1SAT}. \tag{4}$$

Given that $$V_{OH}-V_{DS1SAT}=V_{GG}=V_{OL}+V_{DS2SAT} \tag{5}$$

and that transistors M1 and M2 are matched, it follows that $$I_{SS}=(W_1/L_1)(\mu_N C_{OX}/8)(V_{OH}-V_{OL})^2 \qquad (6)$$

After $I_{SS}$ is set, it is possible to set $V_{GPU}$ to a value that will maintain the gate output low voltage to the value of $V_{OH}$ established earlier. It is possible to replace the pull-up transistors, M5–6, with fixed resistors, or simply tie their gates to $V_{SS}$, as long as the resultant resistance is not less than the optimum value that would otherwise be used. This, of course, causes a deterioration in performance that could be significant, on the order of 50%, but may be acceptable under some circumstances. Lastly, $V_{GPD}$ may be set.

As noted earlier, it is generally desirable to set $I_{PD}$ at some multiple of $I_{SS}$: typically $I_{PD}$ is between one and two times the value of $I_{SS}$. And, as also noted earlier, it is possible to do this by simply setting $V_{GPD}$ equal to $V_{GSS}$ and scaling the widths of transistors M7 and M8 by the desired ratio of $I_{PD}$ to $I_{SS}$. However, the widths of the pull-down transistors may be made an order of magnitude smaller than this by increasing the value of $V_{GPD}$ to a value greater than $V_{GSS}$. Using a separate $V_{GPD}$ voltage in this manner significantly reduces the total area of the SCL gate circuit but does incur the area penalty of routing an additional bias voltage to all gates. Reducing the size of the output pull-down transistors in this manner also improves performance slightly by reducing the capacitive loading on the output nodes. This effect is most significant in low-fanout situations.

One possible means of implementing the method of biasing a SCL gate discussed above is given in FIG. 10. It should be noted that this method of biasing a SCL gate is applicable to both reference controlled SCL and differential SCL. The only difference being that the differential SCL gates would not use the $V_{GG}$ reference signal. In the implementation of FIG. 10, the bias circuit may be broken down into three parts. The first subcircuit is drawn in the upper half of FIG. 10 and consists of transistors M11 through M29 and operational amplifiers AR1 and AR2. It simultaneously solves for $V_{OH}$, $V_{OL}$, $V_{GG}$, $I_{SS}$, and $I_{PD}$ as a function of the power supply voltage $V_{DD}-V_{SS}$. It also provides $V_{GSS}$. The second subcircuit consists of transistors M33 and M37 and op amp AR3; and provides $V_{GPD}$. The third subcircuit consists of transistors M41 through M49 and op amp AR4; and generates the $V_{GPU}$ bias voltage.

In the first subcircuit, transistors M11, M12, and M21 are made to be the same size as the input transistors of the SCL gate, transistors M1 and M2 of FIG. 8. In other words, transistors M1, M2, M11, M12, and M21 are all matched. Likewise, transistor M13 matches transistor M3; and transistors M19 and M29 match M9. The width of transistor M17, $W_{17}$, is used to set the value of the pull-down current, $I_{PD}$, by the following proportionality:

$$W_{17}/W_{19}=I_{PD}/I_{SS} \qquad (7)$$

The gate of transistor M13 is connected to $V_{DD}$ so that $V_{OH}$ appears at its drain. This voltage level is shifted by transistor M11 so that the voltage at its drain is equal to $V_{OH}-V_{T1H}-V_{DS1SAT}$. After being buffered by AR1, this voltage is shifted up by an amount equal to $V_{T1H}$ so that the voltage at the source of M12, $V_{GGH}$, is equal to $V_{OH}-V_{DS1SAT}$ or the left half of equation 5. In order to get a voltage shift of one threshold voltage across M12 it was found through SPICE simulations to be necessary to bias M12 at a current equal to approximately one twenty-fifth of $I_{SS}$ due to sub-threshold effects. This current bias is provided by a current mirror circuit consisting of transistors M15 and M16. A current mirror consisting of transistors M15 and M25, which are matched, provides a current of $I_{SS}$ to transistors M21 and M29. The voltage developed across these transistors, $V_{GGL}$, is $$V_{GGL}=V_{DS9SAT}+V_{T1L}+V_{DS1SAT}=V_{OL}+V_{DS1SAT} \qquad (8)$$

which is the same as the right half of equation 5. To ensure that transistor M29 does not enter its saturation region, it is actually made slightly wider than M19 by approximately ten percent. Then, to compensate for this, M21 is made slightly narrower. Note that as $V_{GSS}$ and $I_{SS}$ increase, $V_{GGH}$ decreases and $V_{GGL}$ increases. AR2 compares the values of $V_{GGH}$ and $V_{GGL}$ and sets $V_{GSS}$ to the one voltage that will drive them both to the same value. Note that $V_{GSS}$ equals $V_{DS9SAT}+V_{T9}$ which is approximately equal to $V_{OL}$ (see equation 2). In fact, if it were not for the bulk effect, they would equal exactly. Therefore, $V_{GSS}$ is assumed to equal $V_{OL}$ in this implementation of the bias circuit since the bulk effect is not significant for small values of $V_{DS9SAT}$. Note that as $V_{DD}-V_{SS}$ changes, $V_{OH}$, $V_{OL}$, $V_{GG}$, $I_{SS}$, $I_{PD}$, and $V_{GSS}$ all track this change so that the SCL gates driven by this circuit all operate at their optimum bias for AC performance. Furthermore, since transistors M11, M12, M13, M19, M21 and M29 all match their respective counterparts in the SCL gates on the same integrated circuit die, various hard-to-control effects, such as the bulk effect, channel length modulation, variations in threshold voltage due to channel length, and other short channel effects, are automatically compensated.

In the second subcircuit, transistor M33 matches transistors M3 and M13. Like M13, the gate of M33 is tied to $V_{DD}$. Operational amplifier AR3 is then used to drive the gate of M37 as necessary to set the voltage at the source of M33 equal to $V_{OH}$. At this point, the current flowing through M33 and M37 is equal to $I_{PD}$. The width of M37 does not need to be the same as that of transistor M17 and, in fact, may be less than one tenth the width of M17. Regardless of what width is used for M37, this transistor must match the size of the SCL gate pull-down transistors, M7 and M8.

In the third subcircuit, transistor M47 matches M37, M7, and M8; and is also driven by $V_{GPD}$ so that its drain current is equal to IPD. Transistor M49 matches transistors M19 and M9; and is driven by $V_{GSS}$ so that its drain current equals $I_{SS}$. In a similar vein, transistor M41 matches transistors M1, M2, M11, and M12; transistor M43 matches transistors M33, M13, M3, and M4; and transistor M45 matches the size of the SCL gate pull-up transistors, M5 and M6. With the gate of transistor M41 connected to $V_{GG}$, the gate of M43 connected to the drains of M41 and M45, and the gate of M45 connected to $V_{GPU}$, this circuit reproduces the conducting transistors in a SCL gate when its output is low. Amplifier AR4 is used to maintain $V_{GPU}$ at a value that keeps the source voltage of M43 equal to $V_{OL}$ (or $V_{GSS}$).

A consequence of the biasing method as it has been described so far, is that the voltage gain of the SCL gates thus produced is unity. Any practical logic circuit needs to have a gain of greater than unity so that it will be able to overcome various signal path losses and device parameter mismatches, as well as maintain a sufficient degree of noise immunity. It is a simple matter to increase the gain of the SCL gates connected to a bias circuit by simply reducing the $I_{SS}$ of the gates relative to the $I_{SS}$ of the bias circuit; and this is easily accomplished by reducing the width of M9 in FIG. 8 relative to M19 in FIG. 10. The voltage gain thus produced is inversely proportional to modified the value of $W_9$, $W_9'$, as follows.

$$A_V=W_9/W_9'=W_{19}/W_9. \qquad (9)$$

To accomplish this, the width of M49 in the bias circuit must also be changed by the same factor (i.e., $W_{49}=W_9'$) in order to maintain the correct value of $V_{OL}$. This, of course, increases the value of the pull-up resistors and causes an increase in gate propagation delay that is proportional to gain. Fortunately, it is not necessary to increase the gain of the SCL gates by much since the SCL logic levels are not used for communication between ICs.

Methods of translating the reference controlled SCL logic levels of this invention with other widely adopted logic levels are shown in FIGS. 10–14. These translation circuits are presented as various input and output buffers.

Figure 11:
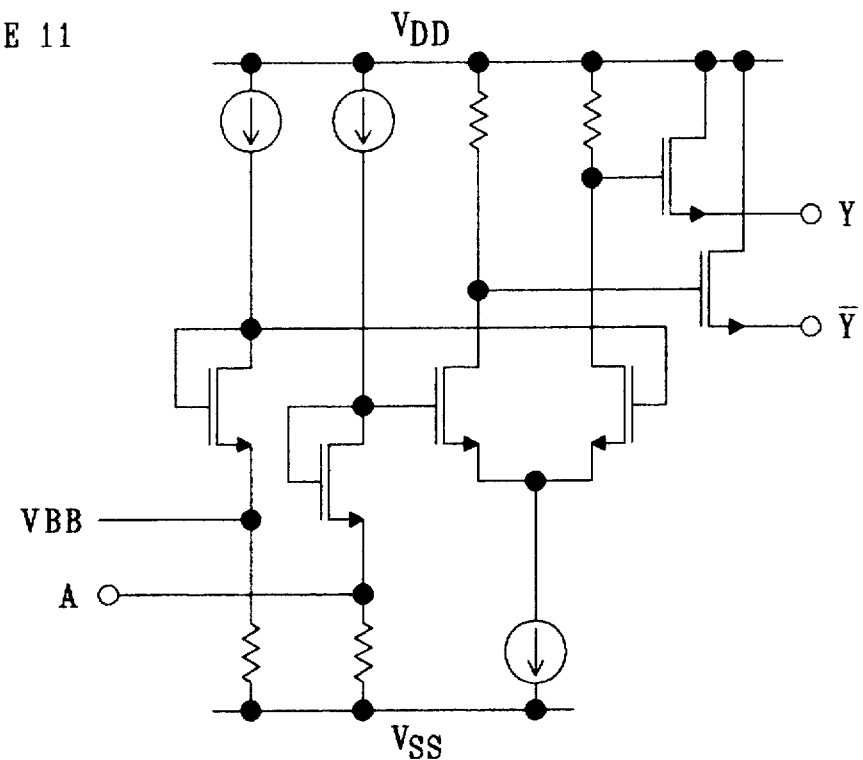
FIG. 11 shows the essential elements of an ECL compatible input buffer.

One implementation of an ECL compatible input buffer is shown in FIG. 11. Not shown in this schematic diagram, or any of the other I/O diagrams, are the input ESD protection circuits. The ECL input signal, A, is connected to an input pull-down resistor, having a typical value of approximately 50K, that serves to keep an open input from floating high. Next, a diode-connected MOSFET is used to shift the ECL level input voltage, which could have a range of $V_{SS}$ to $V_{SS}+1.4V$, to a range that is more suitable for SCL. Junction diodes, or even resistors, may also be used for this purpose. Each input signal is then compared with a similarly shifted version of $V_{BB}$. This ECL reference voltage could be generated on-chip or, for maximum noise immunity, generated by the ECL chip supplying the input signal. Each SCL chip would need at most only one $V_{BB}$ pin, as these are not differential signals. The input comparator circuit is a modified SCL gate. In order to provide a high degree of noise immunity this gate should have a DC gain of four or more. For an input buffer, this may be done by increasing the widths of the input transistors rather than decreasing $I_{SS}$ so as to maintain performance.

Figure 12:
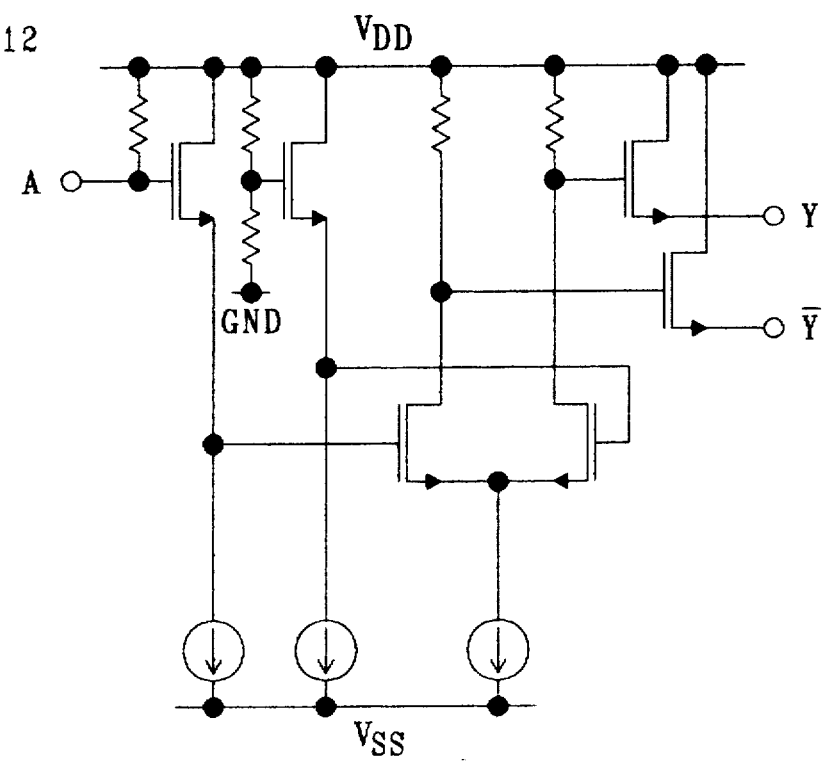
FIG. 12 shows the essential elements of a TTL and/or 3V CMOS compatible input buffer.

An input buffer circuit that is compatible with both TTL and 3V CMOS logic levels is shown in FIG. 12. This circuit is very similar to the ECL input buffer discussed above. Here the input is pulled up by a resistor having a value of 2K or greater; and then shifted down by a source follower. The input threshold voltage, generated by an internal voltage divider network, is similarly shifted. Both signals are then applied to a standard internal SCL gate. The shifted TTL voltage levels are sufficiently large so that no additional gain is needed by the input inverter/buffer.

An input buffer that is compatible with 5V CMOS, i.e. CMOS that is connected to $V_{DD}$ and $V_{SS}$, may be made by connecting the node labeled "GND" in FIG. 12 to $V_{SS}$. In other words, by changing the input threshold level. Alternately, the input buffer may be dispensed with altogether and the 5V CMOS signals connected directly to the internal SCL circuits. In general, the basic technique shown in FIGS. 11 and 12 may be applied to any arbitrary input logic level by simply employing the appropriate voltage level shift and adjusting the gain of the input SCL gate as required.

Figure 13:
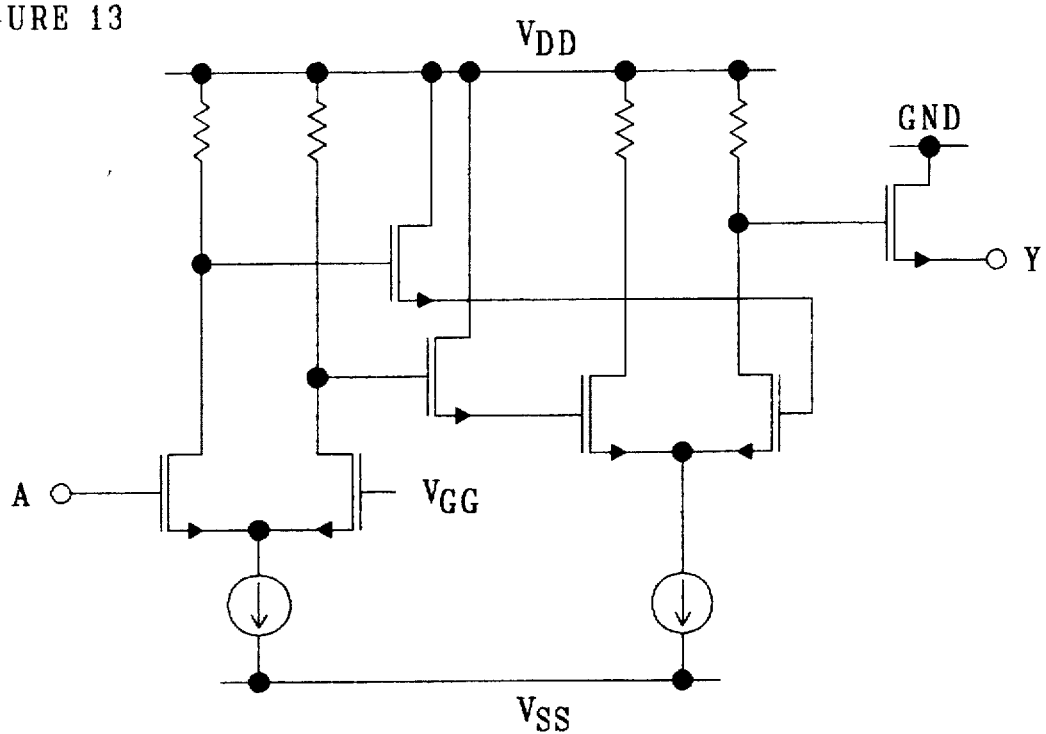
FIG. 13 shows the essential elements of an ECL compatible output buffer.

One implementation of an ECL compatible output buffer is shown in FIG. 13. This circuit consists of two cascaded amplifiers that are successively scaled to drive a very large output transistor that is capable of conducting 25 mA with less than 720 mV of loss. The second amplifier stage is driven differentially to minimize the size of its differential pair of transistors.

Figure 14:
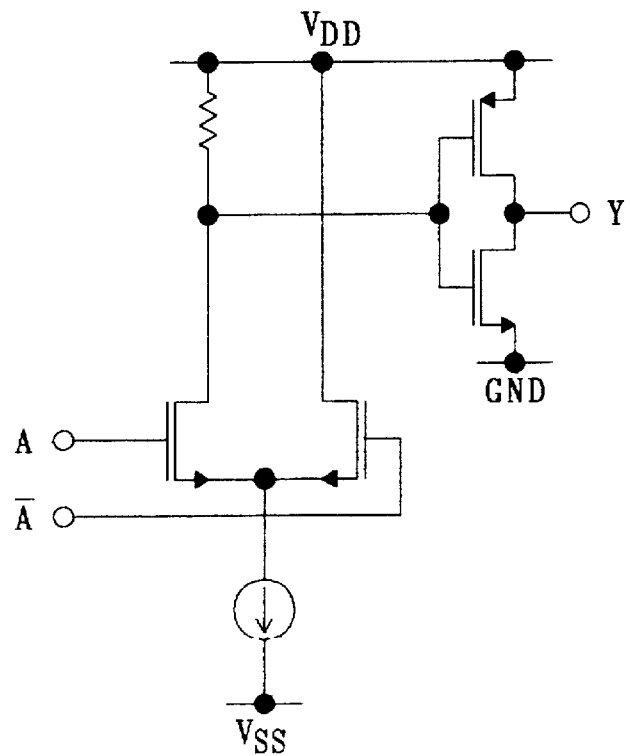
FIG. 14 shows the essential elements of a TTL and/or 3V CMOS compatible output buffer.

An output buffer circuit that is compatible with both TTL and 3V CMOS logic levels is shown in FIG. 14. This circuit consists of a modified SCL gate, sans the source followers, driving a large CMOS inverter. The current source for the input pair of transistors is about twice as large as usual and the SCL gate is driven differentially to ensure that the voltage across the "resistor" goes to nearly $V_{SS}$. This is followed by a conventional two-transistor CMOS inverter to develop the output signal, Y.

An output buffer that is compatible with 5V CMOS may be constructed by using the same circuit but connecting the source of the NMOS transistor in the output inverter to $V_{SS}$ rather than ground. Since the input to this CMOS inverter output stage cannot be driven all the way to $V_{SS}$, this stage must be scaled for a threshold voltage that is halfway between $V_{DD}$ and $V_{SS}+V_{DS9SAT}+V_{DS1SAT}$.

While particular embodiments of the invention have been shown, it should be clear that numerous variations to the invention are possible. In particular, while the preferred embodiment of this invention is fabricated on a silicon substrate, any semiconducting material may be used. The following claims are intended to cover all such variations as fall within the spirit and scope of the invention.

I claim:

1. An MOSFET, reference controlled, source-coupled logic circuit for connection between a first power bus and a second power bus having a substantially constant potential difference between the buses, the logic circuit comprising:

(a) a pair of MOSFET input transistors each having a source and an output and connected in a source-coupled arrangement, a first one of the input transistors having a gate forming a logic circuit input and the other input transistor having a gate connected to an external bias circuit shared by other logic circuits, each input transistor having a threshold voltage $V_T$;

(b) first and second pull-up resistive circuit elements each connected between the output of a respective different one of the input transistors and the first power bus;

(c) at least one output transistor connected as a source-follower, the output transistor having an input connected to the output of one of the input transistors and having an output forming a circuit output, said output transistor having a logic low output voltage $V_{OL}$ with respect to the second power bus; and (d) a transistor, for conveying a substantially constant current, connected between the coupled input transistor sources and the second power bus and having an input connected to said bias circuit shared by multiple logic circuits, the constant current being controlled by the bias circuit and having a drain to source voltage at saturation $V_{DSSAT}$ and wherein $V_{OL}$ is substantially equal to $V_{DSSAT}+V_T$.

2. A circuit in accordance with claim 1 further comprising additional input transistors connected in parallel to said first input transistor for providing a multiple input logical OR/NOR switching function.

3. A circuit in accordance with claim 1 further comprising additional input transistors connected in series with said first input transistor for providing a multiple input logical AND/NAND switching function.

4. A circuit in accordance with claim 3 further comprising additional input transistors connected in parallel to said first input transistor for providing a multiple input logical OR/NOR switching function.

5. A circuit in accordance with claim 4 wherein at least one of said transistors is P-type and at least one of said transistors is N-type.

6. A circuit in accordance with claims 1 or 2 or 3 or 4 or 5 wherein each of the pull-up resistive circuit elements is a MOSFET transistor having a gate connected to said bias circuit for supplying a transistor conductance controlling voltage for regulating the constant current, Iss, for achieving said $V_{OL}$ to substantially $$I_{ss} = \left(\frac{W}{L}\right)\left(\frac{\mu C_{ox}}{8}\right)(V_{OH} - V_{OL})^2$$

wherein

W=channel width of the input MOSFET transistors

L=channel length of the input MOSFET transistors

μ=the mobility of the input MOSFET transistors $C_{ox}$=capacitance per unit area of the input MOSFET transistors gate dielectric $V_{OH}$=logic high output voltage of the output transistor.

7. A circuit in accordance with claim 6 wherein each MOSFET pull-up transistor has a gate connected to the second power bus.

8. A circuit in accordance with claims 1 or 2 or 3 or 4 or 5 and further comprising a second output transistor connected as a source follower and having an input connected to the output of a second one of the input transistors, the second output transistor having an output forming a second circuit output.

9. A circuit in accordance with claims 1 or 2 or 3 or 4 or 5 further comprising a pull-down resistive circuit element connected to the output of each output transistor and the second power bus.

10. A circuit in accordance with claim 9 wherein the pull down resistive circuit element further comprises at least one pull-down transistor connected between each output and the second power bus, the pull-down transistor controlled by a substantially constant voltage supplied by said bias circuit connected to an input of the pull-down transistor.

11. A circuit in accordance with claim 10 wherein the same bias circuit voltage is applied to both the pull-down transistor and the constant current transistor.

12. A circuit comprising at least two source coupled logic circuits each in accordance with claim 1 wherein the outputs of the logic circuits are merged into a single transistor and the single transistor is connected to a pull-up resistive circuit element to perform a logical AND switching function.

13. A circuit comprising at least two source coupled logic circuits each in accordance with claim 1, each logic circuit having an output transistor, the output transistors being connected in series to perform a logical AND switching function.

14. A circuit in accordance with claim 1 wherein the power buses are each connected to a different power supply, each power supply being connected to a common or ground for providing logic level and analog circuit compatibility.

15. A circuit in accordance with claim 1 wherein an analog circuit connected to said logic circuit is located on the same semiconductor die as said logic circuit.

16. A circuit in accordance with claim 1 wherein the same semiconductor die on which said source coupled logic circuit is located also includes at least one different type logic circuit connected to said MOSFET logic circuit selected from the group of logic circuits consisting of bipolar logic, CMOS logic, bi-CMOS logic.

17. A circuit in accordance with claim 1 wherein the output transistor is a bipolar junction transistor for maximizing the output high voltage.

18. A circuit in accordance with claim 9 further including an output buffer circuit comprising:

(a) a pair of buffer transistors connected in a source-coupled arrangement, the inputs of the buffer transistors connected to the outputs of said output transistors, the coupled sources of the buffer transistors connected to a constant current source and the outputs of the buffer transistors connected to resistive circuit elements; and (b) a buffer output transistor having one output connected to the common or ground and the other output forming the buffer circuit output, the input of the buffer output transistor connected to one of the buffer transistor outputs.

19. An MOSFET, reference controlled, source-coupled logic circuit for connection between a first power bus and a second power bus having a substantially constant potential difference between the buses, the logic circuit comprising:

(a) a pair of MOSFET input transistors each having a source and an output and connected in a source-coupled arrangement, a first one of the input transistors having a gate forming a logic circuit input and the other input transistor having a gate connected to an external bias circuit shared by other logic circuits;

(b) first and second pull-up resistive circuit elements each connected between the output of a respective different one of the input transistors and the first power bus;

(c) at least one output transistor connected as a source-follower, the output transistor having an input connected to the output of one of the input transistors and having an output forming a circuit output;

(d) a transistor, for conveying a substantially constant current, connected between the coupled input transistor sources and the second power bus and having an input connected to said bias circuit shared by multiple logic circuits, the constant current being controlled by the bias circuit; and (e) an input buffer circuit connected to the logic circuit input and including a differential comparator circuit and a voltage shifting circuit for translating the logic voltage levels applied to the input buffer circuit to logic levels compatible with said logic circuit.

20. An MOSFET, reference controlled, source-coupled logic circuit for connection between a first power bus and a second power bus having a substantially constant potential difference between the buses, the logic circuit comprising:

(a) a pair of MOSFET input transistors each having a source and an output and connected in a source-coupled arrangement, a first one of the input transistors having a gate forming a logic circuit input and the other input transistor having a gate connected to an external bias circuit shared by other logic circuits;

(b) first and second pull-up resistive circuit elements each connected between the output of a respective different one of the input transistors and the first power bus;

(c) at least one output transistor connected as a source-follower, the output transistor having an input connected to the output of one of the input transistors and having an output forming a circuit output;

(d) a transistor, for conveying a substantially constant current, connected between the coupled input transistor sources and the second power bus and having an input connected to said bias circuit shared by multiple logic circuits, the constant current being controlled by the bias circuit; and (e) an output buffer circuit connected to the logic circuit output and including an SCL gate followed by a CMOS inverter for translating the logic voltage levels from the logic circuit output to other logic levels.

* * * * *